United States Patent
Chang et al.

(10) Patent No.: US 9,209,095 B2
(45) Date of Patent: Dec. 8, 2015

(54) III-V, GE, OR SIGE FIN BASE LATERAL BIPOLAR TRANSISTOR STRUCTURE AND METHOD

(71) Applicant: International Business Machines Corporation, Armonk, NY (US)

(72) Inventors: Josephine B. Chang, Mahopac, NY (US); Gen P. Lauer, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/245,683

(22) Filed: Apr. 4, 2014

(65) Prior Publication Data

US 2015/0287650 A1   Oct. 8, 2015

(51) Int. Cl.
*H01L 27/12*   (2006.01)
*H01L 21/84*   (2006.01)
(Continued)

(52) U.S. Cl.
CPC .......... *H01L 21/845* (2013.01); *H01L 21/0257* (2013.01); *H01L 21/02532* (2013.01);
(Continued)

(58) Field of Classification Search
CPC ............... H01L 27/1211; H01L 21/823431; H01L 21/823821; H01L 21/02532; H01L 21/324; H01L 21/02595; H01L 21/0257; H01L 21/225; H01L 21/244; H01L 21/3065; H01L 21/02538; H01L 21/8249; H01L 21/2053; H01L 21/2056; H01L 29/6656; H01L 29/66545; H01L 29/6681; H01L 29/6625; H01L 29/735; H01L 29/66553; H01L 29/6631; H01L 29/785; H01L 29/7858; H01L 29/41791; H01L 29/66772; H01L 29/66795; H01L 27/0886; H01L 27/0924; H01L 27/10826; H01L 27/10879; H01L 21/845
See application file for complete search history.

(56) References Cited

U.S. PATENT DOCUMENTS 6,759,730 B2   7/2004   Chaudhry et al.
7,235,846 B2   6/2007   Fung
(Continued)

FOREIGN PATENT DOCUMENTS

CN   102800590 A   11/2012
CN   102842600 A   12/2012
(Continued)

OTHER PUBLICATIONS

Suligoj et al., "A Low-cost Horizontal Current Bipolar Transistor (HCBT) Technology for the BiCMOS Integration with FinFETs," 2003 International Semiconductor Device Research Symposium, pp. 518-519, (Dec. 2003).
(Continued)

*Primary Examiner* — Matthew Landau
*Assistant Examiner* — Grant Withers
(74) *Attorney, Agent, or Firm* — Louis J. Percello; Michael J. Chang, LLC (57) ABSTRACT

In one aspect, a method of fabricating a bipolar transistor device on a wafer includes the following steps. Fin hardmasks are formed on the wafer. A dummy gate is formed on the wafer, over the fin hardmasks. The wafer is doped to form emitter and collector regions on both sides of the dummy gate. A dielectric filler layer is deposited onto the wafer and the dummy gate is removed selective to the dielectric filler layer so as to form a trench in the filler layer. Fins are patterned in the wafer using the fin hardmasks exposed within the trench, wherein the fins will serve as a base region of the bipolar transistor device. The fins are recessed in the base region. The base region is re-grown from an epitaxial SiGe, Ge or III-V semiconductor material. A contact is formed to the base region.

18 Claims, 8 Drawing Sheets

(51) Int. Cl.

| | | |
|---|---|---|
| *H01L 21/3065* | (2006.01) | |
| *H01L 21/02* | (2006.01) | |
| *H01L 21/24* | (2006.01) | |
| *H01L 21/324* | (2006.01) | |
| *H01L 21/225* | (2006.01) | |
| *H01L 29/66* | (2006.01) | |
| *H01L 29/735* | (2006.01) | |
| *H01L 29/417* | (2006.01) | |
| *H01L 29/78* | (2006.01) | |
| *H01L 27/088* | (2006.01) | |
| *H01L 27/092* | (2006.01) | |
| *H01L 27/108* | (2006.01) | |

(52) U.S. Cl.
CPC .... *H01L21/02538* (2013.01); *H01L 21/02595* (2013.01); *H01L 21/225* (2013.01); *H01L 21/244* (2013.01); *H01L 21/3065* (2013.01); *H01L 21/324* (2013.01); *H01L 27/0886* (2013.01); *H01L 27/0924* (2013.01); *H01L 27/10826* (2013.01); *H01L 27/10879* (2013.01); *H01L 27/1211* (2013.01); *H01L 29/41791* (2013.01); *H01L 29/6625* (2013.01); *H01L 29/6631* (2013.01); *H01L 29/6656* (2013.01); *H01L 29/6681* (2013.01); *H01L 29/66545* (2013.01); *H01L 29/66553* (2013.01); *H01L 29/66772* (2013.01); *H01L 29/66795* (2013.01); *H01L 29/735* (2013.01); *H01L 29/785* (2013.01); *H01L 29/7831* (2013.01)

(56) References Cited

U.S. PATENT DOCUMENTS

| | | | | |
|---|---|---|---|---|
| 7,834,403 | B2 * | 11/2010 | Kakoschke et al. | 257/370 |
| 7,923,337 | B2 * | 4/2011 | Chang et al. | 438/303 |
| 8,183,120 | B2 | 5/2012 | Kakoschke et al. | |
| 8,258,602 | B2 * | 9/2012 | Ke et al. | 257/586 |
| 8,445,892 | B2 | 5/2013 | Cohen et al. | |
| 8,536,029 | B1 * | 9/2013 | Chang et al. | 438/479 |
| 8,609,495 | B2 * | 12/2013 | Gan et al. | 438/275 |
| 8,618,636 | B1 * | 12/2013 | Chang et al. | 257/565 |
| 2005/0184360 | A1 * | 8/2005 | Ho et al. | 257/565 |
| 2005/0272231 | A1 * | 12/2005 | Yun et al. | 438/585 |
| 2007/0012945 | A1 * | 1/2007 | Sugizaki | 257/124 |
| 2007/0102772 | A1 * | 5/2007 | Lojek | 257/401 |
| 2007/0102789 | A1 * | 5/2007 | Bryant et al. | 257/565 |
| 2007/0200178 | A1 * | 8/2007 | Yun et al. | 257/353 |
| 2010/0207208 | A1 * | 8/2010 | Bedell et al. | 257/346 |
| 2010/0295022 | A1 * | 11/2010 | Chang et al. | 257/24 |
| 2010/0320572 | A1 * | 12/2010 | Chung et al. | 257/588 |
| 2011/0278676 | A1 * | 11/2011 | Cheng et al. | 257/369 |
| 2012/0032732 | A1 * | 2/2012 | Xiao et al. | 327/537 |
| 2012/0049282 | A1 * | 3/2012 | Chen et al. | 257/347 |
| 2012/0313170 | A1 * | 12/2012 | Chang et al. | 257/347 |
| 2012/0313216 | A1 * | 12/2012 | Cai et al. | 257/526 |
| 2012/0314485 | A1 * | 12/2012 | Cai et al. | 365/156 |
| 2012/0319178 | A1 * | 12/2012 | Chang et al. | 257/287 |
| 2013/0105897 | A1 * | 5/2013 | Bangsaruntip et al. | 257/351 |
| 2013/0153993 | A1 * | 6/2013 | Chang et al. | 257/330 |
| 2013/0153996 | A1 * | 6/2013 | Chang et al. | 257/334 |
| 2013/0161762 | A1 * | 6/2013 | Kelly et al. | 257/401 |
| 2013/0168771 | A1 * | 7/2013 | Wu et al. | 257/351 |
| 2013/0175624 | A1 * | 7/2013 | Chang et al. | 257/347 |
| 2013/0214357 | A1 * | 8/2013 | Chang et al. | 257/347 |
| 2014/0048870 | A1 * | 2/2014 | Ryu | 257/330 |
| 2014/0264280 | A1 * | 9/2014 | Kim et al. | 257/29 |
| 2014/0264591 | A1 * | 9/2014 | Wang et al. | 257/347 |
| 2014/0264602 | A1 * | 9/2014 | Basker et al. | 257/347 |
| 2014/0284719 | A1 * | 9/2014 | Khakifirooz et al. | 257/351 |
| 2014/0284760 | A1 * | 9/2014 | Cheng et al. | 257/528 |
| 2014/0306297 | A1 * | 10/2014 | Ching et al. | 257/401 |
| 2014/0370683 | A1 * | 12/2014 | Cheng et al. | 438/311 |
| 2014/0377926 | A1 * | 12/2014 | Kim et al. | 438/289 |
| 2015/0021715 | A1 * | 1/2015 | Chang et al. | 257/412 |
| 2015/0034899 | A1 * | 2/2015 | Ching et al. | 257/9 |
| 2015/0061013 | A1 * | 3/2015 | Basu et al. | 257/347 |
| 2015/0091094 | A1 * | 4/2015 | Wan et al. | 257/369 |
| 2015/0091100 | A1 * | 4/2015 | Xie et al. | 257/401 |
| 2015/0102348 | A1 * | 4/2015 | Cai et al. | 257/69 |
| 2015/0129962 | A1 * | 5/2015 | Xie et al. | 257/347 |
| 2015/0144998 | A1 * | 5/2015 | Ching et al. | 257/190 |

FOREIGN PATENT DOCUMENTS

| | | |
|---|---|---|
| JP | 4797185 B2 | 10/2011 |
| WO | WO9312541 A1 | 6/1993 |

OTHER PUBLICATIONS

Helmut Foll, "Semiconductors I, 5.1.4 Wavelength Engineering" Kiel University, Germany (accessed on Aug. 14, 2013).
Li et al., "The base dopant out diffusion and the optimized setback layers in SiGe HBT," Proceedings from the 6th International Conference on Solid-State and Integrated-Circuit Technology 2001, vol. 1, pp. 596-599 (Oct. 2001).
Computer translation of CN102800590 (Feb. 2013).
Computer translation of CN102842600 (Feb. 2013).
Computer translation of JP4797185 (Feb. 2013).

* cited by examiner

FIG. 15

III-V, GE, OR SIGE FIN BASE LATERAL BIPOLAR TRANSISTOR STRUCTURE AND METHOD

FIELD OF THE INVENTION

The present invention relates to fin base lateral bipolar transistor devices and more particularly, to fin base lateral bipolar transistor devices having a III-V, Ge, or SiGe base and techniques for fabrication thereof.

BACKGROUND OF THE INVENTION

Bipolar transistors are electronic devices with two P-N junctions that are in close proximity to one another. A common bipolar transistor has three regions: i) an emitter, ii) a collector, and iii) a base present between the emitter and the collector. If the emitter and the collector are doped with an n-type dopant and the base is doped with a p-type dopant, then the device is an "NPN" transistor. Alternatively, if the emitter and the collector are doped with a p-type dopant and the base is doped with an n-type dopant, then the device is a "PNP" transistor.

Despite the prevalence of CMOS FETs, bipolar transistors have superior device attributes in some areas, especially for analogue and power gain applications. Conventional bipolar devices require abrupt emitter-to-base junctions and well controlled base region lengths and are typically not scaled for circuit density of CMOS structures.

Vertical configurations can be used to reduce the size of semiconductor devices, such as bipolar transistors. See, for example, U.S. patent application Ser. No. 13/607,877, filed by J. Sleight et al., entitled "Fin Bipolar Transistors Having Self-Aligned Collector and Emitter Regions," the entire contents of which are incorporated by reference herein.

However, as feature sizes of the devices get increasingly smaller, contacting the collector and emitter regions with the contact line becomes a major problem. In some instances, collector and emitter regions are used to contact the fins in order to provide mechanical stability during processing. However, the collector and emitter regions still need to be precisely aligned with the contact line in order to achieve a practical contact line pitch and to minimize variations in extrinsic resistance and parasitic capacitance. Thus, properly and consistently aligning the collector and emitter regions with the contact line is difficult.

Therefore, improved vertical bipolar transistor designs and techniques for fabrication thereof would be desirable.

SUMMARY OF THE INVENTION

The present invention provides techniques for integrating a III-V, SiGe, or Ge fin base bipolar transistor with CMOS finFET technology. In one aspect of the invention, a method of fabricating a bipolar transistor device on a wafer is provided. The method includes the following steps. Fin hardmasks are formed on the wafer. A dummy gate is formed on the wafer, over the fin hardmasks. Spacers are formed on opposite sides of the dummy gate. The wafer is doped to form emitter and collector regions on both sides of the dummy gate. A dielectric filler layer is deposited onto the wafer, surrounding the dummy gate. The dummy gate is removed selective to the dielectric filler layer so as to form a trench in the dielectric filler layer, wherein removal of the dummy gate exposes the fin hardmasks present on the wafer within the trench. Fins are patterned in the wafer using the fin hardmasks exposed within the trench, wherein the fins will serve as a base region of the bipolar transistor device. The fins are recessed in the base region. The base region is re-grown from an epitaxial SiGe, Ge or III-V semiconductor material. A contact is formed to the base region.

In another aspect of the invention, a method of co-fabricating at least one finFET device and at least one bipolar transistor device on a wafer is provided. The method includes the following steps. FinFET fin hardmasks and bipolar transistor fin hardmasks are formed on the wafer. At least one finFET dummy gate is formed on the wafer, over the finFET fin hardmasks, and at least one bipolar transistor dummy gate is formed on the wafer, over the bipolar transistor fin hardmasks. Spacers are formed on opposite sides of the finFET dummy gate and on opposite sides of the bipolar transistor dummy gate. The wafer is doped to form emitter and collector regions on both sides of the bipolar transistor dummy gate. The wafer is doped to form source and drain regions on both sides of the finFET dummy gate. A dielectric filler layer is deposited onto the wafer, surrounding the finFET dummy gate and the bipolar transistor dummy gate. The finFET dummy gate and the bipolar transistor dummy gate are removed selective to the dielectric filler layer so as to form trenches in the dielectric filler layer, wherein removal of the finFET dummy gate and the bipolar transistor dummy gate exposes the finFET fin hardmasks and the bipolar transistor fin hardmasks present on the wafer within the trenches. Fin-FET fins are patterned in the wafer using the finFET fin hardmasks exposed within a first one of the trenches which will serve as a channel region of the finFET device, and bipolar transistor fins are patterned in the wafer using the bipolar transistor fin hardmasks exposed within a second one of the trenches which will serve as a base region of the bipolar transistor device. The bipolar transistor fins are recessed in the base region of the bipolar transistor device. The base region of the bipolar transistor device is re-grown from an epitaxial SiGe, Ge or III-V semiconductor material. A replacement gate of the finFET device is formed over the channel region of the finFET device. Contacts to the replacement gate of the finFET device and to the base region of the bipolar transistor device are formed.

In yet another aspect of the invention, a bipolar transistor device is provided. The device includes emitter and collector regions formed in a wafer; and a base region formed from fins patterned in the wafer between the emitter and collector regions, wherein the fins are recessed and contains an epitaxial material selected from the group consisting of: SiGe, Ge, and a III-V material.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for a fin base bipolar transistor fabrication wherein the base is formed from a III-V, Ge, or SiGe material for enhanced performance. Namely, conventional fin base bipolar transistor designs, for example, have silicon (Si)-based designs. See, for example, U.S. patent application Ser. No. 13/607,877, filed by J. Sleight et al., entitled "Fin Bipolar Transistors Having Self-Aligned Collector and Emitter Regions," the entire contents of which are incorporated by reference herein. However, the use of materials other than Si can lead to design performance enhancements. For instance, III-V materials can have significantly higher electron mobility than Si.

The present techniques are now described by way of reference to FIGS. 1-15 which provide an exemplary methodology for fabricating a fin base bipolar transistor. The present techniques can be integrated with a fin-last, gate-last, replacement gate flow, such as that described, e.g., in U.S. Pat. No. 7,923,337, issued to Chang et al., entitled "Fin Field Effect Transistor Devices with Self-Aligned Source and Drain Regions," the entire contents of which are incorporated by reference herein. Accordingly, the present process flow will be shown integrated with a replacement gate finFET process. This is meant solely as an example, and if so desired the present techniques may be implemented, in the same manner described herein, to fabricate a bipolar transistor device(s) alone, i.e., independent of other devices on the wafer. Thus, it is to be understood that the depiction of the co-fabrication of a finFET device(s) and a bipolar transistor device(s) on a wafer is only an example intended to show how the present techniques are compatible with a replacement gate finFET fabrication process. Further, for ease and clarity of depiction, the fabrication of one finFET device and one bipolar transistor device is shown. However, multiple finFET and/or bipolar transistor devices may be fabricated in the manner described herein.

Figure 1:
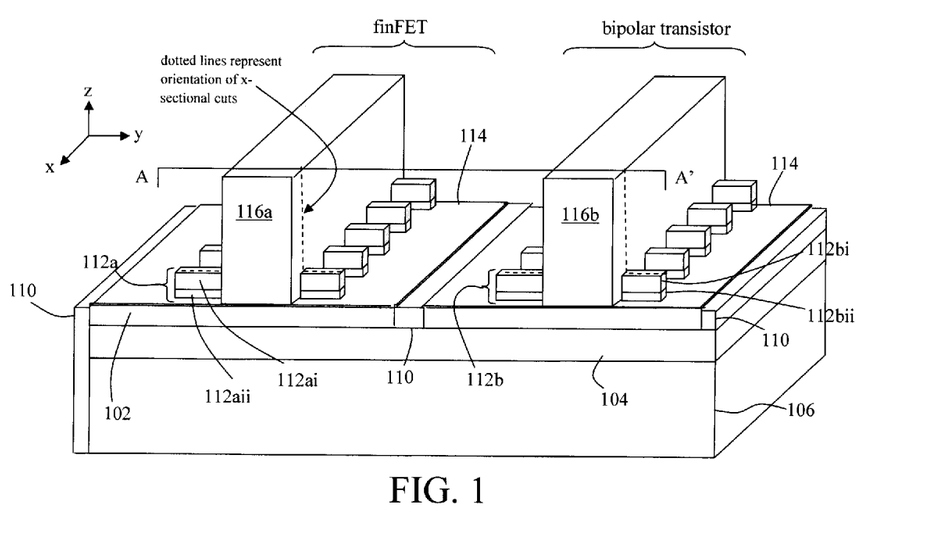
FIG. 1 is a three-dimensional diagram illustrating a starting platform for a finFET and lateral bipolar transistor fabrication process flow, including a SOI wafer, and finFET/bipolar transistor fin hardmasks and dummy gates having been formed on the wafer according to an embodiment of the present invention.

As shown in FIG. 1, the starting platform for the process is a semiconductor wafer, such as a bulk semiconductor (e.g., silicon (Si), silicon germanium (SiGe), Ge, etc.) or semiconductor-on-insulator (SOI) wafer. In the example depicted in FIG. 1, a SOI wafer is employed. As shown in FIG. 1, the SOI wafer includes an SOI layer 102 separated from a substrate 106 by a buried oxide (or BOX) 104.

According to an exemplary embodiment, the SOI layer 102 is formed from a semiconductor material including, but not limited to, Si, SiGe, Ge, and a III-V semiconductor material. The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations including at least one of the foregoing materials. According to an exemplary embodiment, the III-V material is indium gallium arsenide (InGaAs).

As highlighted above, by way of non-limiting example, the figures will depict the formation of one finFET device and one fin base bipolar transistor device on the wafer. Accordingly, for clarity of depiction, these regions "finFET" and "bipolar transistor" are shown labeled in the figures. Further, as shown in FIG. 1, the active regions of the wafer (i.e., in which the devices will be formed) are separated using standard isolation techniques, such as shallow trench isolation (STI), i.e., STI regions 110.

Fin hardmasks 112a and 112b are formed in the finFET and bipolar transistor device regions, respectively. The fin hardmasks will define a footprint and location of the fin-shaped channels of the respective devices. According to an exemplary embodiment, the fin hardmasks 112a/112b are a "dual hardmask" structure containing an oxide portion 112aii/112bii on the SOI layer 102 and a nitride portion 112ai/112bi on the oxide portion, patterned using a two-step reactive ion etching (RIE) process. The use of a dual hardmask structure permits more precise and uniform nanowires to be formed in the SOI layer. Namely, with the dual hardmask structure, the nitride portion protects the integrity of the oxide portion during dummy gate definition (see below), and the oxide portion protects the fins during spacer (nitride-selective) etch (see below). Maintaining good integrity of the hardmasks is important for minimizing variations in fin dimensions. As device sizes become increasingly smaller, the effect of unwanted dimensional variations becomes even more pronounced.

The present techniques employ a damascene gate process. To begin the damascene gate process, dummy gate structures 116a/116b are formed on the wafer, over the hardmasks 112a/112b in the finFET and bipolar transistor regions, respectively. See FIG. 1. Prior to forming the dummy gates, it is preferable that an oxide stopping layer 114 is formed on the SOI layer 102 using, for example, thermal oxidation. The oxide stopping layer 114 is preferably a thin layer, i.e., having a thickness of less than or equal to about 4 nanometers (nm), e.g., less than or equal to about 2 nm. The oxide stopping layer 114 will protect the SOI layer 102 during subsequent (e.g., gate) etching processes.

According to an exemplary embodiment, the dummy gate structures (or simply the dummy gates) are formed from polycrystalline silicon (polysilicon). Namely, a polysilicon layer can be blanket deposited onto the wafer, covering the hardmasks 112a/112b in the finFET and bipolar transistor regions. The thickness of the polysilicon layer will determine a height of the dummy gates, which can be adjusted for instance using chemical-mechanical polishing (CMP) if so desired.

A resist film (not shown) can be deposited on the polysilicon layer, masked and patterned with a footprint and location of the dummy gates in both the finFET and bipolar transistor regions. A polysilicon-selective RIE can then be used to pattern the dummy gates 116a/116b in the finFET and bipolar transistor regions concurrently.

The depictions of the process will now shift to cross-sectional cuts through the gates, along the center of one of the fin hardmasks (i.e., cross-sectional cuts along plane A-A'—see FIG. 1). Spacers 202 and 204 are next formed on opposite sides of the dummy gates 116a and 116b, respectively. See FIG. 2. According to an exemplary embodiment, the spacers are formed concurrently in the finFET and bipolar transistor device regions by first depositing a spacer material (e.g., a nitride material such as silicon nitride), and then patterning the material to form the spacers 202 and 204.

It is notable that many of the present processing steps can be performed in an order other than that being described herein. For instance, in the instant example wherein a finFET and a bipolar transistor device are being co-fabricated on a common wafer, (as will be presented below) the emitter/collector doping is performed first followed by the source/drain doping. However, the order in which these steps are performed is immaterial to the overall process.

Thus, according to one exemplary embodiment, doping of the collector and emitter regions in the bipolar transistor device(s) is now performed. See FIG. 3. In the case where a finFET device(s) is/are being fabricated on the same wafer, it is preferable to first mask the finFET device(s) (e.g., using a resist or hardmask) to prevent doping in the FET devices. Suitable hardmask materials include, but are not limited to, nitride materials such as silicon nitride (SiN). Standard lithography and etching techniques can be used to pattern the mask. See FIG. 3.

Figure 3:
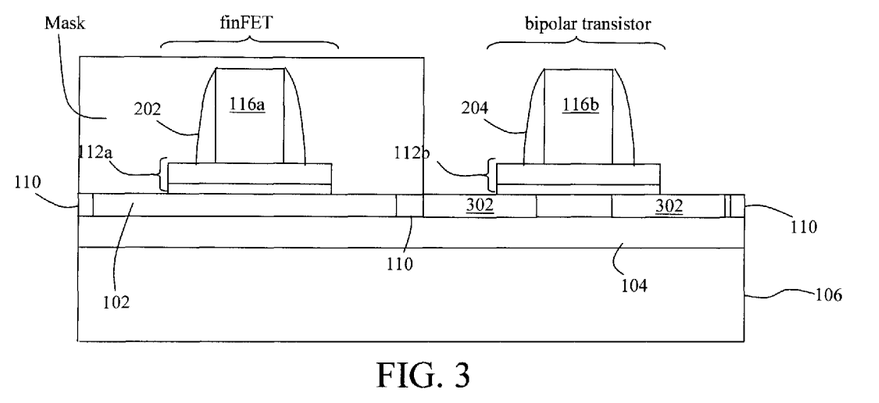
FIG. 3 is a cross-sectional diagram illustrating emitter and collector regions having been formed in the bipolar transistor device(s) while the finFET device(s) is/are masked according to an embodiment of the present invention.

Emitter/collector doping is then performed to form doped emitter/collector regions 302 (either N+ or P+) on both sides of the dummy gate 116b (in the bipolar transistor device(s)). Conventional doping processes can be employed. Alternatively, the doping can also be achieved using solid source diffusion. In either case, the dopant dose can be from about $5 \times 10^{18}$ atoms/cm$^3$ to about $5 \times 10^{20}$ atoms/cm$^3$, e.g., from about $5 \times 10^{19}$ atoms/cm$^3$ to about $2 \times 10^{20}$ atoms/cm$^3$. In an NPN bipolar transistor configuration, both sides of dummy the gate 116b can receive a number of successive implants of boron ions at various energies. In a PNP bipolar transistor configuration, both sides of the dummy gate 116b can receive successive implantation steps of either arsenic or phosphoric ions.

Figure 4:
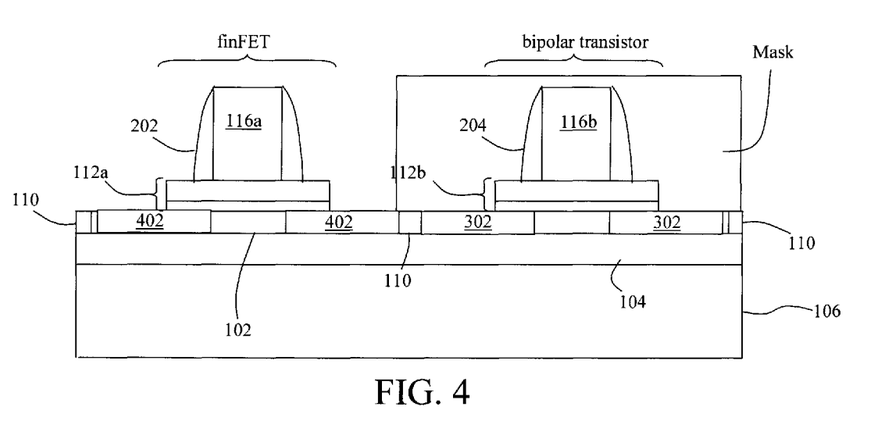
FIG. 4 is a cross-sectional diagram illustrating source and drain regions having been formed in the finFET device(s) while the bipolar transistor device(s) are masked according to an embodiment of the present invention.

Following the emitter/collector doping, the mask can be removed from the finFET device(s). The same general process can also be used dope source/drain regions 402 on both sides of the dummy gate 116a (in the finFET device(s)). See FIG. 4. As shown in FIG. 4, a mask (e.g., resist or hardmask) can be formed covering the bipolar transistors (in the same manner as described above), and a conventional dopant implantation process can be used to form the source and drain regions 402 of the finFET device(s). The order in which the emitter/collector (FIG. 3) and source/drain doping (FIG. 4) is performed is immaterial and these processes can be performed in either order. Following the source/drain doping, the mask can be removed from the bipolar transistor device(s).

Figure 5:
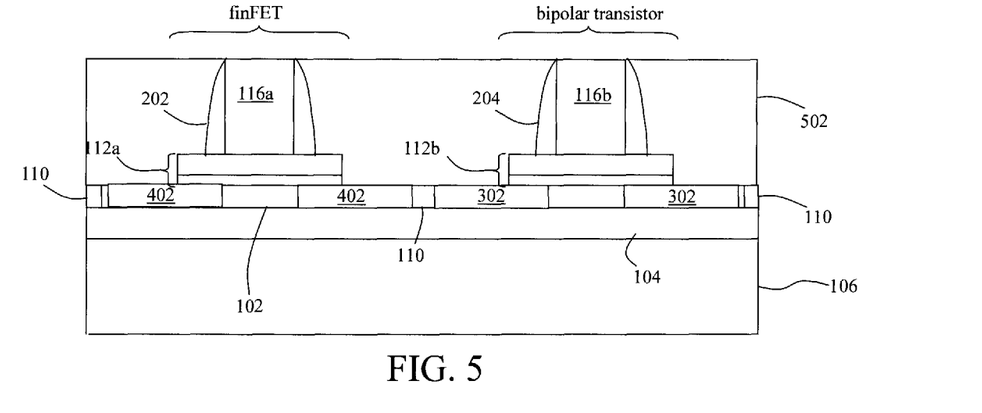
FIG. 5 is a cross-sectional diagram illustrating a dielectric filler layer having been deposited around the dummy gates according to an embodiment of the present invention.

Next, a dielectric filler layer 502 is blanket deposited onto the wafer, surrounding the dummy gates. See FIG. 5. As shown in FIG. 5, the dielectric filler layer 502 is then planarized down to a top of the dummy gates. This will permit removal of the dummy gates (selective to the dielectric filler layer) later on in the process. Planarization of the dielectric filler layer 502 can be performed using chemical mechanical polishing (CMP).

Figure 6:
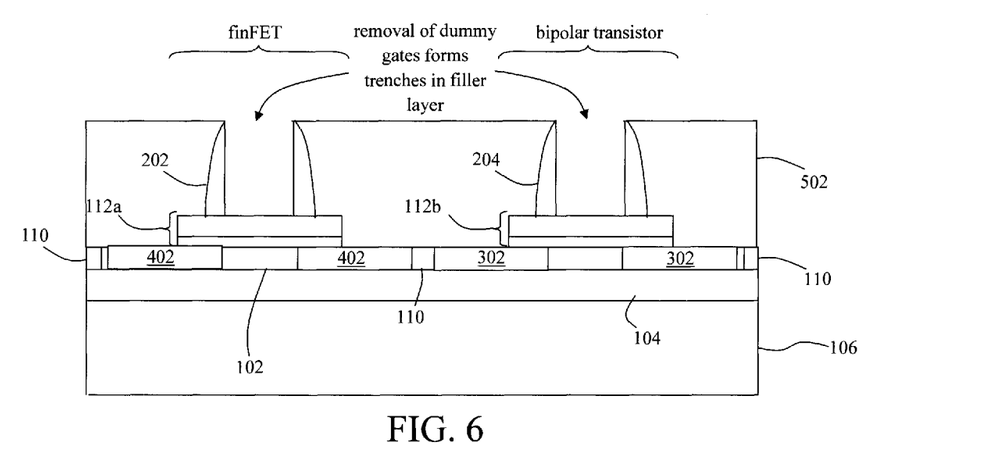
FIG. 6 is a cross-sectional diagram illustrating the dummy gates having been removed, forming trenches in the dielectric filler layer according to an embodiment of the present invention.

As shown in FIG. 6, the dummy gates 116a and 116b are then removed from the finFET and bipolar transistor devices. The dummy gates 116a and 116b can be removed selective to the dielectric filler layer 502 and spacers 202/204 using wet chemical etching or dry etching. Removal of the dummy gates results in trenches being formed in the dielectric filler layer.

Figure 7:
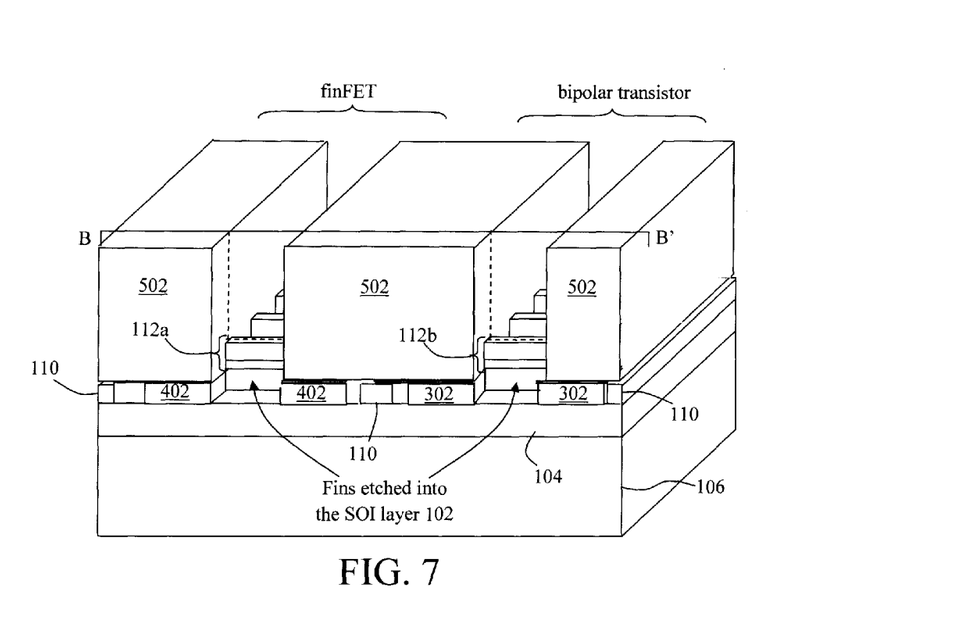
FIG. 7 is a three-dimensional diagram illustrating the fin hardmasks having been used to pattern channel region/base region fins in the finFET and bipolar transistor devices, respectively, according to an embodiment of the present invention.

Switching back to a three-dimensional representation of the structure in FIG. 7, it is shown that removal of the dummy gates reveals (exposes) the fin hardmasks 112a and 112b present in the trenches (in the dielectric filler layer) in the finFET and bipolar transistor device regions of the wafer. As shown in FIG. 7, the fin hardmasks 112a and 112b are then used to etch fins into the SOI layer 102 in both the finFET and bipolar transistor device regions of the wafer. The fins will serve as channel regions of the finFET device(s) and as precursors (as per the re-growth process described below) to a base region of the bipolar transistor device(s).

According to an exemplary embodiment, a reactive ion etching (RIE) process is used to form the fins, with the BOX 104 acting as an etch stop. The fins patterned in this manner will have sharp, well-defined edges. As described above, this is a result of using dual (nitride/oxide) hardmasks to pattern the nanowires. An advantage of the present teachings is that nanowire bars are etched only within the trenches, leaving the emitter/collector regions 302 and the source/drain regions 402 intact below the dielectric filler layer 502. Thus, the emitter/collector and source/drain regions will be self-aligned with the trenches and thus with a base/replacement gate that will be formed in the trenches, respectively (see below).

Figure 8:
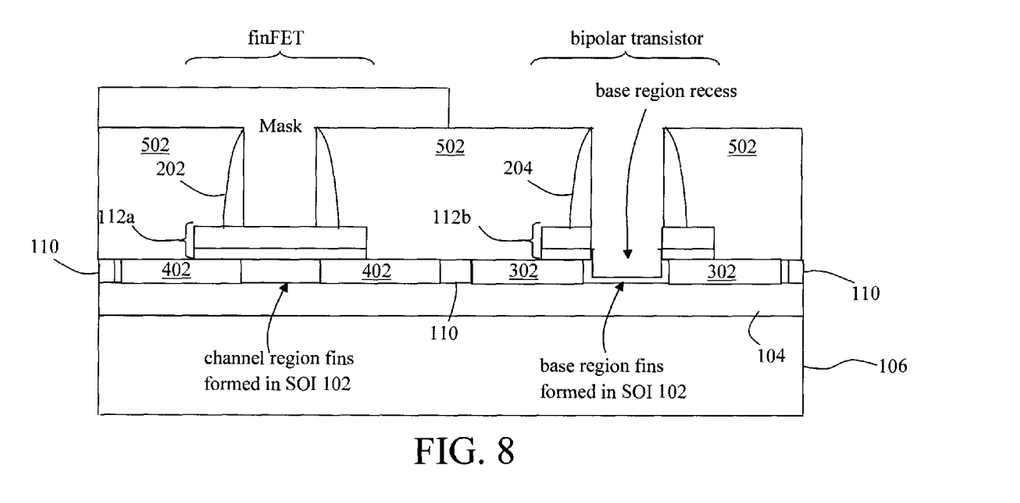
FIG. 8 is a cross-sectional diagram illustrating selective masking of the finFET device(s) and the base region fins in the bipolar transistor device(s) having been recessed according to an embodiment of the present invention.

Switching back to cross-sectional cuts through the gates, along the center of one of the fins (i.e., cross-sectional cuts along plane B-B'—see FIG. 7), as shown in FIG. 8 the base regions in the bipolar transistor device(s) (which are the portions of the fins in the bipolar transistor device(s) exposed within the trench (see above)) are recessed. It is noted that while the cross-sectional depictions show the process being performed on the particular finFET fin (channel) and bipolar transistor fin (base) visible in the figures, the same processes are being performed on all of the fins patterned as per FIG. 7 (described above). In order to permit selective processing of the base regions (i.e., vis-à-vis the channel regions of the finFET device(s)), it is preferable to first form a mask (e.g., resist or hardmask) covering the finFET device(s).

It is notable that following patterning of the fins (see description of FIG. 7, above) a portion of the fin hardmask may remain over the patterned fins. With regard to the finFET device(s), it may be suitable to leave that remaining fin hardmask in place, or alternatively to remove it. With regard to the bipolar transistor device(s), in order to recess the base regions it is preferable to remove any remaining fin hardmask. The fin hardmask can be removed from the patterned fins using, for example, a wet etching process. This wet etching process can be performed before or after masking of the finFET device(s), depending on whether the fin hardmask removal is desired in both the finFET and bipolar transistor devices or just in the bipolar transistor device(s).

The base recess in the bipolar transistor device(s) can be performed using a selective etch, such as a RIE process. The emitter and collector regions are covered/protected by the dielectric filler layer 502 and (as provided above) the finFET device(s) are masked.

A RIE process, for example, is anisotropic and if employed will result in portions of the fin base below/masked by the spacers 204 to remain following the base recess etch. See FIG. 8. Further, the etch should be endpointed prior to removing all of the fin (SOI) material at the bottom of each base. These remaining portions of the fins at the bottom and sides of the base will be used to template re-growth of the base using SiGe, Ge or a III-V semiconductor material.

Figure 9:
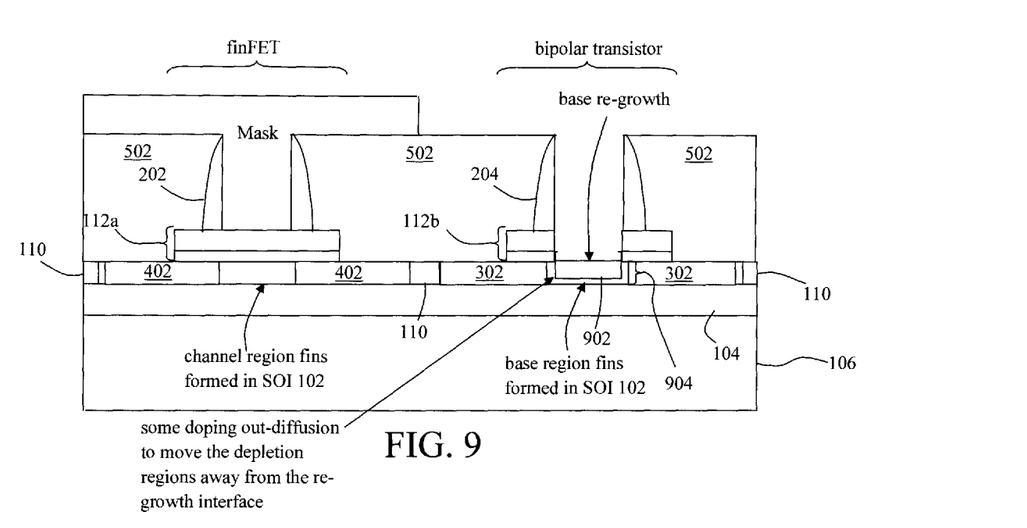
FIG. 9 is a cross-sectional diagram illustrating epitaxy having been used to re-grow the base regions of the bipolar transistor device(s) according to an embodiment of the present invention.

Namely, as shown in FIG. 9, epitaxial re-growth of the base regions in the bipolar transistor device(s) is next performed. According to an exemplary embodiment, the base regions are re-grown at this stage from an epitaxial SiGe, Ge or III-V semiconductor material 902. Re-growth of the base material permits the base to be formed from a different material than the collector and emitter regions (i.e., that of the SOI layer 102). In fact, the material from which to re-grow the base is preferably chosen such that the bandgap in the base is smaller than the bandgap of the collector/emitter. As provided above, the collector/emitter regions are formed from doped portions of the SOI layer 102. As also provided above, the SOI layer can be formed from a semiconductor material, such as Si, SiGe, Ge, and a III-V semiconductor material. Thus, depending on the contents of SOI layer 102, the base is preferably re-grown from a material with a lower bandgap than the SOI layer. Bandgap data for each of the above-described SOI and base materials may be found in the published literature. See, for instance, Helmut Foll, "Semiconductors I, 5.1.4 Wavelength Engineering" Kiel University, Germany (accessed on Aug. 14, 2013) (which on page 1 of section 5.1.4 provides bangap and lattice constant data for a variety of different materials, including Si, Ge, and III-V materials) (hereinafter "Foll"), the entire contents of which are incorporated by reference herein. In the bandgap charts provided in Foll, the lines represent alloys of the materials. Thus one can adjust the bandgap along those lines. Therefore, selection of the SOI and base materials can be performed accordingly. To use a simple example, if the collector and emitter regions (based on the composition of SOI layer 102) are formed from gallium arsenide, then a suitable choice for the base might be epitaxial Ge, since Ge has a lower bandgap than gallium arsenide (see Foll).

Further, the base regions can be doped in-situ during this re-growth process. Suitable dopants include, but are not limited to boron (p-type) and phosphorous (n-type). By way of example only, a suitable base doping concentration is from about $1\times10^{17}$ cm$^3$ to about $1\times10^{18}$ cm$^3$, e.g., from about $2\times10^{17}$ cm$^3$ to about $5\times10^{17}$ cm$^3$. It is notable that doping the base regions at this stage is optional, and the base regions can be doped later in process.

When in-situ doping is performed, as shown in FIG. 7, some dopant out-diffusion is preferable to move the depletion region away from the re-growth interface. Base dopant out-diffusion is described generally in Li et al., "The base dopant out diffusion and the optimized setback layers in SiGe HBT," Proceedings from the 6$^{th}$ International Conference on Solid-State and Integrated-Circuit Technology 2001, vol. 1, pgs. 596-599 (October 2001), the entire contents of which are incorporated by reference herein. Out-diffusion can be accomplished using an anneal to "out-diffuse" the dopant(s).

Moving the depletion region away from the re-growth interface (e.g., via out-diffusion) is important since the (epitaxial) re-growth interface is the location most likely to contain crystal defects caused by factors such as lattice mismatch. A small amount of lattice mismatch can be tolerated and results in elastic deformation of the materials (strain sharing). A large amount of lattice mismatch however results in plastic deformation (defects) such as so-called misfit defects. Defects in the depletion region act as carrier generation/recombination centers that reduce the gain of bipolar transistors. So, an anneal that moves the doping far enough that the defects are in a quasi-neutral region is advantageous. The amount of diffusion depends on the width of the depletion region which depends on the doping concentration and the applied biases, as so:

$$W \approx \left[\frac{2\epsilon_r\epsilon_0}{q}\left(\frac{N_A + N_D}{N_A N_D}\right)(V_{bi} - V)\right]^{\frac{1}{2}}$$

Figure 2:
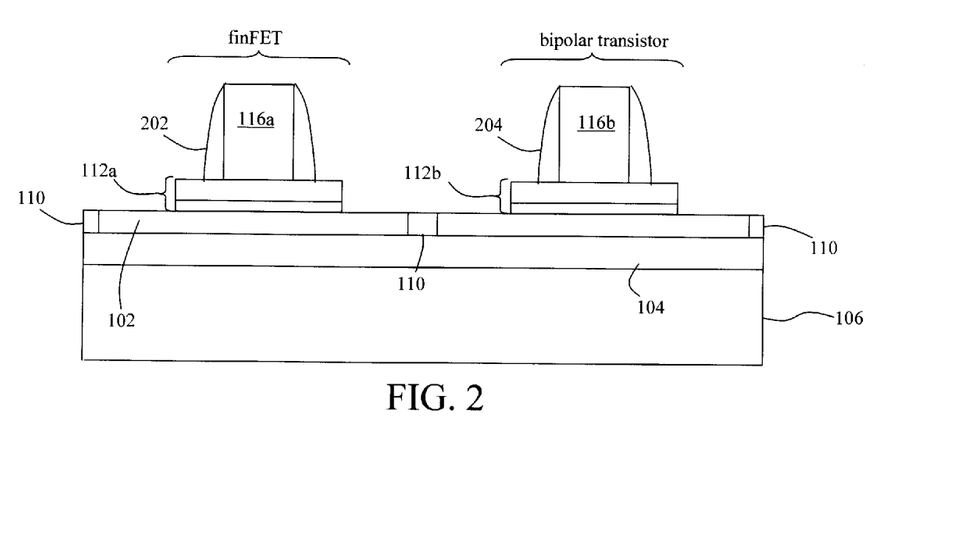
FIG. 2 is a cross-sectional diagram illustrating spacers having been formed on opposite sides of the dummy gates according to an embodiment of the present invention.

By way of example only, when the collector/emitter are highly doped (e.g., as per the exemplary collector and emitter doping concentrations provided in conjunction with the description of FIG. 2, above) the depletion region is preferably moved a distance of less than about 10 nanometers (nm) (e.g., from about 1 nm to about 8 nm) away from the re-growth interface. To use an illustrative, non-limiting example: when the base material is epitaxial Si or SiGe, an anneal at a temperature of from about 900° C. to about 1,000° C. (e.g., about 950° C.) for a duration of from about 5 seconds to about 10 seconds, would move the depletion region the above-described distance away from the re-growth interface.

Hereinafter, the base including doped epitaxial SiGe, Ge or III-V (and associated out-diffusion region) or epitaxial SiGe, Ge or III-V doped later in the process using, e.g., solid-source diffusion (see below) will be given reference numeral 904.

Figure 10:
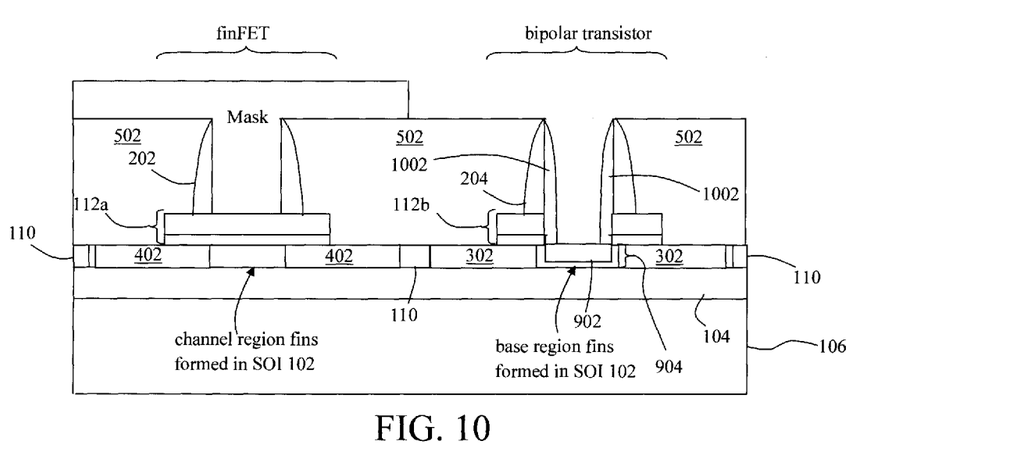
FIG. 10 is a cross-sectional diagram illustrating optional inner spacers having been formed in the bipolar transistor device(s) according to an embodiment of the present invention.

As shown in FIG. 10, optional inner spacers 1002 can be formed in the bipolar transistor device(s). Placing spacers between what will be the collector/emitter regions of the device and the device contact will help to minimize parasitic capacitance in the completed device. According to an exemplary embodiment, spacers 1002 are formed by first depositing a nitride layer into the trench(es) in the dielectric filler layer over the bipolar transistor device(s). A resist film is then deposited on the nitride layer, masked and patterned with the spacer footprints. A nitride-selective RIE is then used to define spacers in the nitride layer. See FIG. 10. The finFET device(s) remain masked during this inner spacer formation process. The remainder of the steps of the process will be illustrated in the figures with the optional inner spacers present, however the same steps would be performed, in the same manner described, whether or not the inner spacers 1002 are present.

According to the instant example, processing of the finFET device(s) is now conducted in order to form a replacement gate in the FET device(s). The sequence of steps described herein is proposed to streamline the fabrication process (e.g., minimize the number of masking steps), to perform steps concurrently—where possible (e.g., dummy gate formation and removal can be performed concurrently in the finFET and bipolar transistor devices), etc. However, this is merely an example and as provided above, performing the processing steps in the order presented is not required.

To begin the replacement gate formation process in the finFET device(s), any masking present over the finFET device(s) is removed. As described above, in this example, the dummy gates have already been removed selective to the dielectric filler layer and spacers. This step (illustrated in FIG. 6 for example) was performed concurrently in both the finFET and bipolar transistor devices. However, it is possible to leave the finFET dummy gate(s) in place until this point in the process when the replacement gate(s) is/are formed. Regardless, as described above, removal of the dummy gate(s) in the finFET device(s) results in a trench(es) being formed in the dielectric filler layer.

Figure 11:
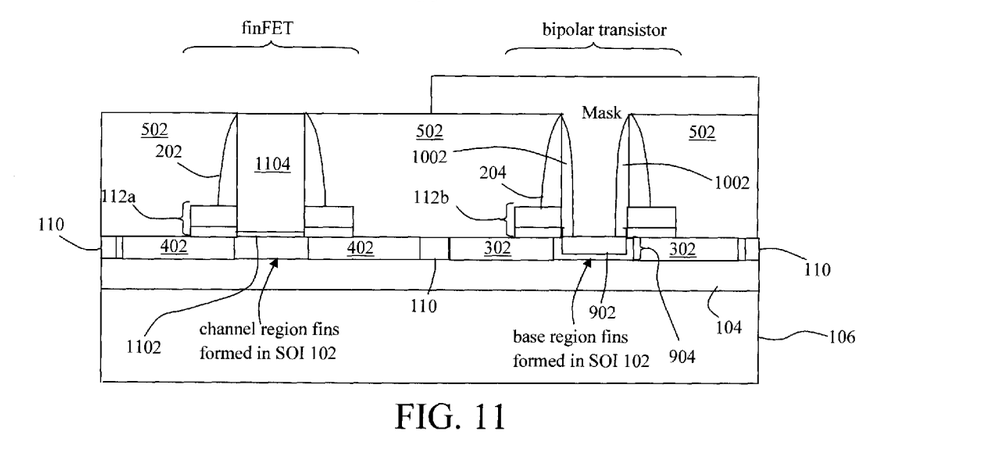
FIG. 11 is a cross-sectional diagram illustrating a mask having been formed to block off the bipolar transistor device(s) and a replacement gate stack(s) having then been formed in the trench(es) in the dielectric filler layer over the finFET device according to an embodiment of the present invention.
Figure 12:
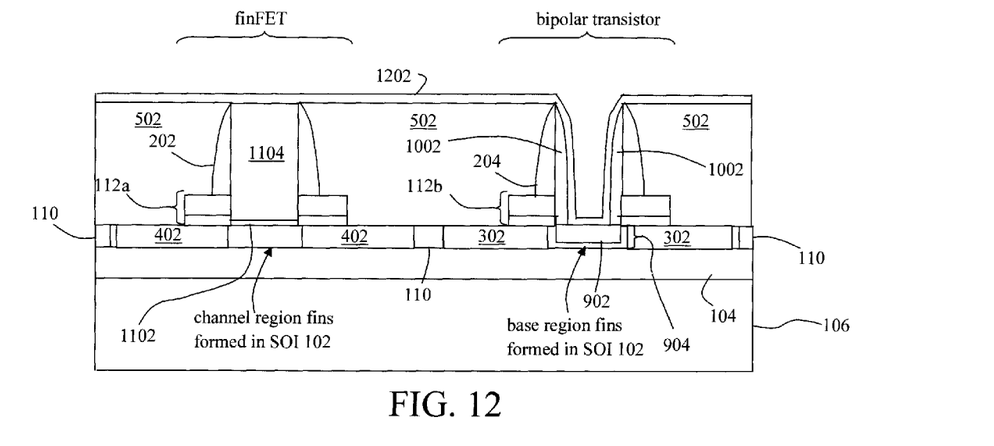
FIG. 12 is a cross-sectional diagram illustrating a layer of polysilicon having been blanket deposited onto the wafer, covering the finFET device(s) and bipolar transistor device(s) according to an embodiment of the present invention.

As shown in FIG. 11, a mask (e.g., resist or hardmask) is first formed to block off the bipolar transistor device(s) during the finFET replacement gate process. Next a replacement gate stack(s) is/are formed in the trench(es) in the dielectric filler layer over the finFET device(s). According to an exemplary embodiment, the replacement gate stack(s) include a gate dielectric 1102 and a gate electrode 1104. The gate dielectric separates the gate electrode from the portions of the fins that will serve as a channel region of the finFET device(s). In general, each FET will include a source region and a drain region interconnected by a channel region, and a gate electrode over the channel region that regulates electron flow through the channel. In the cross-sectional depiction of FIG. 11 (i.e., through one of the fins) the gate dielectric and the gate electrode are visible only on top of the fins. The gate dielectric and gate electrode however preferably surround at least a portion of each of the fins. By way of example only, the gate dielectric and the gate electrode may completely surround at least a portion of each of the fins. This is referred to as a gate-all-around configuration. A gate-all-around configuration requires that space be introduced beneath the fins, such as by undercutting or recessing the BOX. By contrast, when the gate dielectric and the gate electrode surround only a top and sides of the fins, this is referred to as an omega gate since the shape of the gate dielectric and the gate electrode over the fins resembles the symbol omega—Ω. Gate-all-around and omega gate configurations are depicted and described, for example, in U.S. Pat. No. 8,445,892 issued to Cohen et al., entitled "P-FET with a Strained Nanowire Channel and Embedded SiGe Source and Drain Stressors," the entire contents of which are incorporated by reference herein.

The gate electrode can be formed from a metal or combination of metals and/or doped polysilicon. For a metal gate, a high-k dielectric, such as hafnium oxide, is preferred. Following formation of the replacement gate stack(s) in the finFET device(s), the masking over the bipolar transistor device(s) can be removed.

It is notable that in the example depicted in the figures, the fin hardmasks (a portion of which may remain present over the fins prior to replacement gate formation in the finFET device(s)—see FIG. 10) are removed from over the fins. This is not, however, a requirement. If so desired, any of the fin hardmask that remains after the fin etch may optionally remain on top of the fins in the finFET device(s).

As provided above, the base region(s) of the bipolar transistor device(s) may have already been doped, in situ, during re-growth of the (SiGe, Ge, or III-V) base material. If so, then the process now described for doping the base is unnecessary. On the other hand, if the base is yet undoped, then according to an exemplary embodiment, the base region(s) of the bipolar transistor device(s) are now doped using either solid source diffusion or doping agent implant. With solid source diffusion, a dopant-containing material (the solid source) is deposited on the semiconductor to be doped. Suitable dopant-containing materials include, but are not limited to, borosilicate glass (BSG), phospho-silicate glass (PSG), and doped germanium. An anneal is then performed at a temperature of from about 900° C. to about 1,000° C. to allow the dopants in the dopant-containing material or solid-source to diffuse into the semiconductor. The solid source can then be removed using, for example, a hydrofluoric acid (HF) dip. Alternatively, the base implant doping can be applied at an angle to the perpendicular to fine tune the desired base-collector doping level gradient. According to an exemplary embodiment, suitable doping agents include, but are not limited to, boron (p-type) or phosphorous (n-type).

Next, a gate electrode contact is formed in the finFET device(s) and a base contact is formed in the bipolar FET device(s). While the following description and related figures describe these contact-forming processes as being performed concurrently in the finFET and bipolar transistor devices, it is of course possible to process the devices separately, using selective masking as described above. To begin the contact formation process, a layer of polysilicon 1202 is blanket deposited onto the wafer, covering the finFET device(s) and bipolar transistor devices. See FIG. 12. According to an exemplary embodiment, the polysilicon layer 1202 is deposited to a thickness of from about 5 nanometers (nm) to about 30 nm, e.g., from about 10 nm to about 15 nm.

Figure 13:
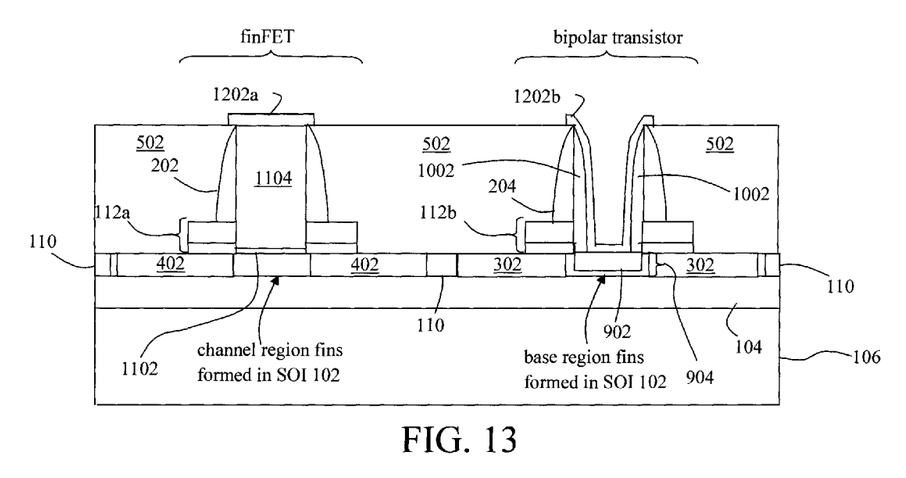
FIG. 13 is a cross-sectional diagram illustrating the polysilicon layer having been removed from over all but the gate electrode in the finFET device(s) and the base of the bipolar transistor device(s) according to an embodiment of the present invention.

Standard lithography and etching techniques are then used to pattern the polysilicon layer 1202, to remove the polysilicon layer from over all but the gate electrode 1104 in the finFET device(s) and the base 904 of the bipolar transistor device(s). For clarity of description, these remaining portions of the polysilicon layer are hereinafter referred to by the reference numerals 1202a and 1202b, respectively. See FIG. 13. As shown in FIG. 13, the patterned polysilicon layer 1202a and 1202b covering the spacers preferably remains.

A self-aligned silicide (i.e., a salicide) is then formed to produce gate electrode and base contacts 1402 and 1404 in the finFET and bipolar transistor devices, respectively. See FIG. 14. To begin the salicide process, a silicide metal is first blanket deposited onto the wafer (using, e.g., sputtering, evaporation, etc.). Suitable silicide metals include, but are not limited to, nickel, platinum, and combinations thereof such as nickel platinum. The process is self-aligned since the silicide will form only in areas where the silicide metal is in contact with the semiconductor (in this case the polysilicon 1202a and 1202b).

Figure 14:
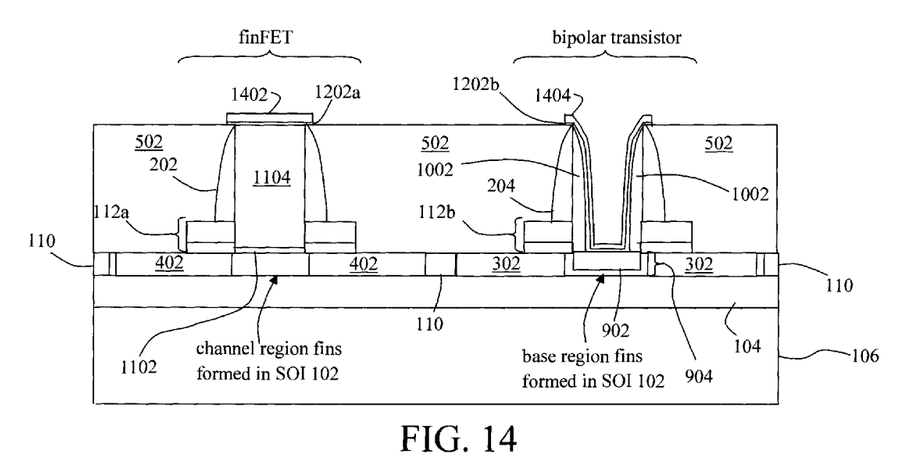
FIG. 14 is a cross-sectional diagram illustrating a self-aligned silicide having been formed to produce gate electrode and base contacts in the finFET and bipolar transistor devices, respectively, according to an embodiment of the present invention.
Figure 15:
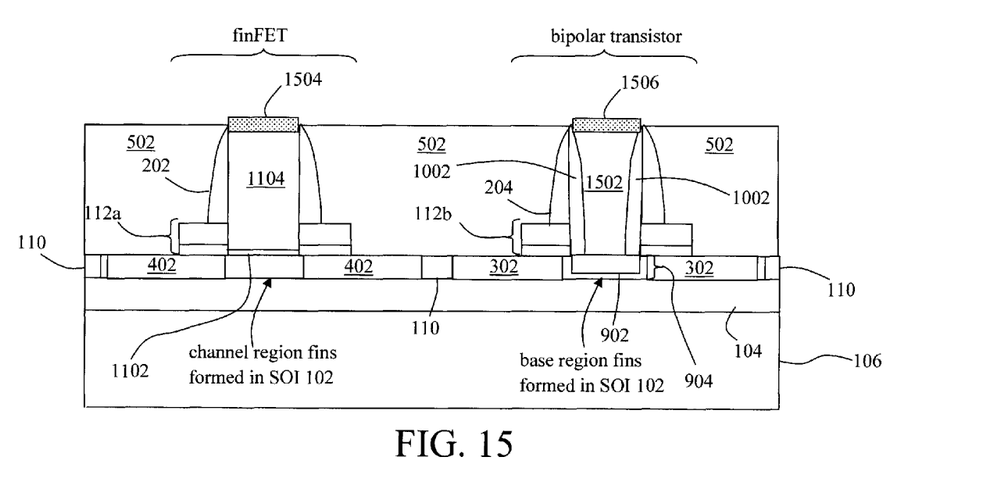
FIG. 15 is a cross-sectional diagram, following from FIG. 11, which illustrates an alternative embodiment wherein epitaxy is used to thicken the base in the bipolar transistor device(s) and salicide gate and base contacts are formed according to an embodiment of the present invention.

Next, an anneal is performed, for example, at a temperature of from about 500° C. to about 1,100° C. for a duration of from about 5 seconds to about 10 seconds, to react the metal with the semiconductor forming a metal silicide. This metal silicide forms the gate electrode and base contacts 1402 and 1404 in the CMOS FET and bipolar transistor devices, respectively. Any unreacted metal can be stripped using a wet etching process. While this silicidation process is generally described herein as a one step anneal (e.g., deposit metal, anneal, strip unreacted metal), it is possible and in some cases preferable to employ a multi-step annealing process (e.g., deposit metal, anneal at a first temperature, strip metal, anneal at a second, higher temperature).

As shown in FIG. 14, a portion of the polysilicon 1202a/1202b can remain under the silicide of the contacts 1402 and 1404. The amount of silicide formed can be controlled based on one or more of the amount of metal deposited, the anneal temperature, duration, etc.

The above-described process is merely one example of how finFETs and bipolar transistor devices can be co-fabricated on a wafer. As provided above, co-fabrication is also an exemplary implementation of the present techniques, as the above-described process can be used in the same manner to fabricate only finFETS or only (SiGe, Ge, III-V material-based) bipolar transistors. Further, one or more alternative steps to the above-described process can be employed. These alternative embodiments are now described.

For instance, in order to make contacting the (bipolar transistor) base easier, in an alternative embodiment, epitaxy can be used to build up the bipolar transistor base. Namely, following from FIG. 11 and after the masking of the bipolar transistor device(s) has been removed, epitaxy can be used to thicken the base 904. It is notable that by this stage in the process the base 904 has already been doped, see above. Here, epitaxy is being used simply to thicken the base. According to an exemplary embodiment, epitaxial SiGe, Ge or a III-V semiconductor material is grown over base 904. Any excess epitaxial material can be removed (e.g., using chemical mechanical polishing (CMP)) such that the remaining extended base 1502 is flush with the dielectric filler layer. See FIG. 15.

Next, the above-described process of depositing and then patterning a polysilicon layer, followed by metal deposition and annealing can be used to form self-aligned silicide (salicide) gate electrode and base contacts. Only in this case, the base contact in the bipolar transistor device(s) would be on top of the extended base 1502. Alternatively, when the finFET replacement gate is formed from a semiconductor material (such as polysilicon), the additional step of polysilicon deposition can be dispensed with, and the contacts can be formed directly from the replacement gate 1104 and extended base 1502. This exemplary embodiment is shown illustrated in FIG. 15. Namely, a suitable silicide metal (see above) can be deposited onto the wafer (using, e.g., sputtering, evaporation, etc.). Then an anneal can be performed (conditions provided above) to react the silicide metal with the semiconductor material in the replacement gate 1104 and extended base 1502 to form self-aligned silicide contacts 1504 and 1506. As described above, the process is self-aligned since the silicide will form only where the metal contacts the gate and base semiconductor. Following the anneal, any unreacted metal can be removed.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a bipolar transistor device on a wafer, the method comprising the steps of:
   forming fin hardmasks on the wafer;
   forming a dummy gate on the wafer, over the fin hardmasks;
   forming spacers on opposite sides of the dummy gate;
   doping the wafer to form emitter and collector regions on both sides of the dummy gate;
   depositing a dielectric filler layer onto the wafer, surrounding the dummy gate;
   removing the dummy gate selective to the dielectric filler layer so as to form a trench in the dielectric filler layer, wherein removal of the dummy gate exposes the fin hardmasks present on the wafer within the trench;
   patterning fins in the wafer using the fin hardmasks exposed within the trench, wherein the fins will serve as a base region of the bipolar transistor device;
   recessing the fins in the base region;
   re-growing the base region from an epitaxial SiGe, Ge or III-V semiconductor material; and
   forming a contact to the base region.

2. The method of claim 1, wherein the wafer comprises a semiconductor-on-insulator (SOI) wafer having a SOI layer separated from a substrate by a buried oxide (BOX), and wherein the SOI layer comprises a material selected from the group consisting of: Si, SiGe, Ge, and a III-V semiconductor material.

3. The method of claim 1, further comprising the step of:
   removing the fin hardmasks from over the fins patterned in the wafer.

4. The method of claim 1, wherein the fins are recessed using a reactive ion etching (RIE) process.

5. The method of claim 1, wherein the base region is re-grown from an epitaxial III-V semiconductor material, wherein the epitaxial III-V semiconductor material is selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

6. The method of claim 1, wherein the epitaxial SiGe, Ge or III-V semiconductor material from which the base region is re-grown is selected so as to have a bandgap that is lower than a material in which the emitter and collector regions are formed.

7. The method of claim 1, further comprising the step of:
   in-situ doping the base region during re-growth of the base region from the epitaxial SiGe, Ge or III-V semiconductor material.

8. The method of claim 1, further comprising the step of:
   forming inner spacers within the trench.

9. The method of claim 1, wherein the step of forming the contact to the base region comprises the steps of:
   depositing a polysilicon layer onto the wafer, covering the bipolar transistor device;
   patterning the polysilicon layer to remove the polysilicon layer from over all but the base region;
   depositing a silicide metal onto the wafer; and
   annealing the wafer to react the silicide metal with the polysilicon layer to form the contact to the base region.

10. The method of claim 9, further comprising the step of:
    removing any unreacted silicide metal.

11. The method of claim 9, wherein a portion of the polysilicon layer remains under the contact to the base region.

12. The method of claim 1, further comprising the step of: thickening the base region using epitaxy.

13. The method of claim 1, further comprising the step of: doping the base region using solid source diffusion.

14. A method of co-fabricating at least one finFET device and at least one bipolar transistor device on a wafer, the method comprising the steps of:
- forming finFET fin hardmasks and bipolar transistor fin hardmasks on the wafer;
- forming at least one finFET dummy gate on the wafer, over the finFET fin hardmasks, and at least one bipolar transistor dummy gate on the wafer, over the bipolar transistor fin hardmasks;
- forming spacers on opposite sides of the finFET dummy gate and on opposite sides of the bipolar transistor dummy gate;
- doping the wafer to form emitter and collector regions on both sides of the bipolar transistor dummy gate;
- doping the wafer to form source and drain regions on both sides of the finFET dummy gate;
- depositing a dielectric filler layer onto the wafer, surrounding the finFET dummy gate and the bipolar transistor dummy gate;
- removing the finFET dummy gate and the bipolar transistor dummy gate selective to the dielectric filler layer so as to form trenches in the dielectric filler layer, wherein removal of the finFET dummy gate and the bipolar transistor dummy gate exposes the finFET fin hardmasks and the bipolar transistor fin hardmasks present on the wafer within the trenches;
- patterning finFET fins in the wafer using the finFET fin hardmasks exposed within a first one of the trenches which will serve as a channel region of the finFET device, and bipolar transistor fins in the wafer using the bipolar transistor fin hardmasks exposed within a second one of the trenches which will serve as a base region of the bipolar transistor device;
- recessing the bipolar transistor fins in the base region of the bipolar transistor device;
- re-growing the base region of the bipolar transistor device from an epitaxial SiGe, Ge or III-V semiconductor material;
- forming a replacement gate of the finFET device over the channel region of the finFET device; and
- forming contacts to the replacement gate of the finFET device and to the base region of the bipolar transistor device.

15. The method of claim 14, wherein the bipolar transistor fins are recessed using a RIE process.

16. The method of claim 14, wherein the base region of the bipolar transistor device is re-grown from an epitaxial III-V semiconductor material, wherein the epitaxial III-V semiconductor material is selected from the group consisting of: aluminum gallium arsenide, aluminum gallium nitride, aluminum indium arsenide, aluminum nitride, gallium antimonide, gallium arsenide, gallium nitride, indium antimonide, indium arsenide, indium gallium arsenide, indium gallium nitride, indium nitride, indium phosphide and combinations comprising at least one of the foregoing materials.

17. The method of claim 14, wherein the epitaxial SiGe, Ge or III-V semiconductor material from which the base region of the bipolar transistor device is re-grown is selected so as to have a bandgap that is lower than a material in which the emitter and collector regions of the bipolar transistor device are formed.

18. The method of claim 14, further comprising the step of: in-situ doping the base region of the bipolar transistor device during re-growth of the base region of the bipolar transistor device from the epitaxial SiGe, Ge or III-V semiconductor material.

\* \* \* \* \*